United States Patent [19]
Sugiyama

[11] Patent Number: 5,657,349
[45] Date of Patent: Aug. 12, 1997

[54] METHOD AND APPARATUS CAPABLE OF QUICKLY IDENTIFYING AN UNKNOWN SYSTEM WITH A FINAL ERROR REDUCED

[75] Inventor: Akihiko Sugiyama, Tokyo, Japan

[73] Assignee: NEC Corporation, Japan

[21] Appl. No.: 521,995

[22] Filed: Aug. 31, 1995

[30]  Foreign Application Priority Data

Sep. 1, 1994 [JP] Japan .................................... 6-208592

[51] Int. Cl.$^6$ ........................... H03H 7/30; H03H 7/40; H03K 5/159
[52] U.S. Cl. ........................ 375/232; 364/724.19
[58] Field of Search .......................... 375/229, 230, 375/231, 232, 233–236, 260, 377, 240; 348/398; 364/724.19, 724.2, 724.16; 381/29, 36, 37

[56]  References Cited

U.S. PATENT DOCUMENTS

| | | | |
|---|---|---|---|
| 5,146,494 | 9/1992 | Harman | 364/724.19 |
| 5,245,561 | 9/1993 | Sugiyama | 364/724.19 |
| 5,500,880 | 3/1996 | Kellerman | 375/377 |

FOREIGN PATENT DOCUMENTS 0492647   7/1992   European Pat. Off. .

OTHER PUBLICATIONS

ICAASP 88, 11–14 Apr. 1988, New York, A. Gilloire et al., Adaptive Filtering In Subbands, pp. 1572–1575.
B. Widrow, et al., "*Adaptive Noise Cancelling: Principles and Application*", Proceedings of IEEE, vol. 63, No. 12, Dec. 1975, pp. 1692–1716.
J. Nagumo, et al., "*A Learning Method for System Identification*", IEEE Transactions on Automatic Control, vol. AC-12, No. 3, 1967, pp. 282–287.
J.J. Shynk, "*Frequency–Domain and Multirate Adaptive Filtering*", IEEE SP Magazine, Jan. 1992, pp. 14–37.

N.A.M. Verhoeckx, et al.; "*Digital Echo Cancellation for Baseband Data Transmission*", IEEE Transactions on Acoustics, Speech and Signal Processing, vol. ASSP-27, No. 6, Dec. 1979, pp. 768–781.

A. Sugiyama, "*An Adaptive Intersubband Tap Assignment Algorithm for Subband Adaptive Filtering with a Colored Input*", Proceedings of 1994 Spring Conference of Institute of Electronics, Information and Communication Engineers, Mar. 1994, pp. 1–173.

P.P. Vaidyanathan, "*Multirate Digital Filters, Filter Banks, Polyphase Networks and Applications: A Tutorial*", Proceedings of the IEEE, vol. 78, No. 1, Jan. 1990, pp.56–93.

S. Wada, et al.,"*Nonsymmetric and Nonuniform Filter Banks*", Proceedings of the 6th Symposium on Digital Signal Processing, Nov. 1991, pp. 269–274.

Primary Examiner—Tesfaldet Bocure
Assistant Examiner—Bryan Webster
Attorney, Agent, or Firm—Ostrolenk, Faber, Gerb & Soffen, LLP

[57]  ABSTRACT

Identifying an unknown system by the use of adaptive filers by supplying the unknown system with an input signal, subjecting the input signal to subband analysis to produce subband signals, and supplying the subband signals to the adaptive filers as input filter signals. An output signal of the unknown system is subjected to subband analysis to produce a predetermined number K of subband reference signals, producing a predetermined number K of subband error signals representative of differences between the subband reference signals and output signals of the adaptive filters. Tap coefficients are renewed in connection with the taps of each of the adaptive filters on the basis of each of the subband error signals. A first circuit varies the number of the taps of each of the adaptive filters in response to a coefficient value signal representative of values of the tap coefficients. A second circuit adaptively controls the number of the taps varied in a single tap-redistribution among subbands.

4 Claims, 9 Drawing Sheets

METHOD AND APPARATUS CAPABLE OF QUICKLY IDENTIFYING AN UNKNOWN SYSTEM WITH A FINAL ERROR REDUCED

BACKGROUND OF THE INVENTION

This invention relates to an identification method and an identification apparatus for identifying an unknown system by the use of an adaptive filter. It is to be noted here that such an adaptive filter is used as an echo canceller, a noise canceller, a howling canceller, an adaptive equalizer, and the like to identify the unknown system, such as a transmission line and a spatial acoustic coupling path, although the following description will be mainly directed to an acoustic echo canceller for cancelling an acoustic echo leaking from a loudspeaker to a microphone in a spatial acoustic coupling path.

The echo canceller is operable so that the acoustic echo leaking from the loudspeaker to the microphone in the spatial acoustic coupling path is canceled by generating a pseudo echo (echo replica) corresponding to a transmission signal by the use of the adaptive filter which has taps of a number covering a time interval longer than the duration of an impulse respons of an echo path. A tap coefficient of each tap of the adaptive filter is modified by monitoring a correlation between a far-end signal and an error signal obtained by subtracting the echo replica from a mixture signal comprising a mixture of the echo and a near-end signal. As typical algorithms for modifying the tap coefficients of the adaptive filter, an LMS (least mean square) algorithm and a learning identification method (LIM) are disclosed in articles which are contributed by B. Widrow et al to Proceedings of IEEE, Vol. 63, No. 12, December, 1975, pages 1692–1716 (will hereinunder be called "Document 1") and contributed by J. Nagumo et al to IEEE Transactions on Automatic Control, Vol. AC-12, No. 3, 1967, pages 282–287 (will hereinunder be called "Document 2"), respectively.

An acoustic space in which the acoustic echo canceller is practically used produces the impulse response having a duration dependent upon a physical dimension of the acoustic space and a reflectivity of a wall or the like. When the acoustic space is difined by a room used in a video conference, the duration of the impulse response corresponds to 1000 taps and sometimes corresponds to several thousands of taps. In view of the calculation amount/the hardware scale, it is often difficult to implement. In order to mainly remove the disadvantage of an increase in calculation amount, adaptive filters of a band-division type (namely, a subband type) are overviewed in an article which is contributed by J. J. Shynk to IEEE SP Magazine, January, 1992, pages 14–37 (will hereinunder be called "Document 3"). The adaptive filter may have various structures for each subband. As a most popular adaptive filter, a FIR (finite impulse response) type adaptive filter is used as described in an article which is contributed by N. A. M. Verhoeck et al to IEEE Transactions on Acoustics, Speech, and Signal Processing, Vol. ASSP-27, No. 6, December, 1979, pages 768–781 (will hereunder be called "Document 4").

The number of taps N of the FIR type adaptive filter corresponding to each subband must be equal to or longer than the duration of the corresponding impulse response in time. In general, when the acoustic echo is subjected to band division, a low-band impulse response is longer than a high-band impulse response as will later be illustrated. This is because the impulse response of the acoustic echo has a duration determined mainly by reflection and because the high-band component has a smaller reflection coefficient and is readily attenuated.

Taking these characteristics into consideration, proposal is made of a band-division adaptive filter which is capable of reducing the calculation amount and shortening a convergence time by adaptively controlling the number of taps of the adaptive filter for each subband. The band-division adaptive filter is disclosed in an article which is contributed by Akihiko Sugiyama to Proceedings of 1994 Spring Conference of Institute of Electronics, Information and Communication Engineers, March 1994, page 1–173 (will hereunder be called "Document 5"). The above-named Akihiko Sugiyama is the instant applicant.

As will later be described, a conventional identification method and apparatus using the band-division adaptive filter disclosed in the Document 5 is incapable of quickly identifying the unknown system with a final error reduced.

SUMMARY OF THE INVENTION

It is therefore an object of this invention to provide a method which is capable of quickly identifying an unknown system with a final error reduced.

It is another object of this invention to provide an apparatus which is capable of quickly identifying an unknown system with a final error reduced.

Other objects of this invention will become clear as the description proceeds.

A method to which this invention is applicable is for identifying an unknown system by the use of a predetermined number K of adaptive filters, each having a plurality of taps, where K is an integer greater than one. The method includes the steps of: supplying the unknown system with an input signal; subjecting the input signal to subband analysis to produce a predetermined number K of subband signals; supplying the subband signals to the adaptive filters as filter input signals, respectively; subjecting an output signal of the unknown system to subband analysis to produce a predetermined number K of subband reference signals; producing a predetermined number K of subband error signals representative of differences between the subband reference signals and output signals of the adaptive filters, respectively; and renewing tap coefficients in connection with the taps of each of the adaptive filters on the basis of each of the subband error signals.

According to a first aspect of this invention, the method comprises the steps of: varying the number of the taps of each of the adaptive filters in response to a coefficient value signal representative of values of the tap coefficients in connection with the taps of each of the adaptive filters and to an input information signal relating to each of the filter input signals; and adaptively controlling the number of the taps varied in a single tap-redistribution among subbands with reference to continuous variations of the number of the taps varied among the subbands.

According to a second aspect of this invention, the method comprises the steps of: varying the number of the taps of each of the adaptive filters in response to a coefficient value signal representative of values of the tap coefficients in connection with the taps of each of the adaptive filters and to an input information signal relating to each of the filter input signals; and adaptively controlling the number of the taps varied in a single tap-redistribution among subbands with reference to a relative relationship of the number of the taps varied among the subbands.

An apparatus to which this invention is applicable is for identifying an unknown system by supplying the unknown system with an input signal. The apparatus includes: a predetermined number K of adaptive filters, each having a plurality of taps, where K is an integer greater than one; a first analysis filter bank supplied with the input signal for subjecting the input signal to subband analysis to produce a predetermined number K of subband signals which are supplied to the adaptive filters as filter input signals, respectively; a second analysis filter bank supplied with an output signal of the unknown system for subjecting the output signal of the unknown system to subband analysis to produce a predetermined number K of subband reference signals; and a predetermined number K of subtracters for producing a predetermined number K of subband error signals representative of differences between the subband reference signals and output signals of the adaptive filters, respectively, to make each of the adaptive filters renew tap coefficients in connection with the taps of each of the adaptive filters on the basis of each of the subband error signals.

According to a third aspect of this invention, the apparatus comprises: a first circuit connected to the adaptive filters for varying the number of the taps of each of the adaptive filters in response to a coefficient value signal representative of values of the tap coefficients in connection with the taps of each of the adaptive filters and to an input information signal relating to each of the filter input signals; and a second circuit connected to the first circuit for adaptively controlling the number of the taps varied in a single tap-redistribution among subbands with reference to continuous variations of the number of the taps varied among the subbands.

According to a fourth aspect of this invention, the apparatus comprises: a first circuit connected to the adaptive filters for varying the number of the taps of each of the adaptive filters in response to a coefficient value signal representative of values of the tap coefficients in connection with the taps of each of the adaptive filters and to an input information signal relating to each of the filter input signals; and a second circuit connected to the first circuit for adaptively controlling the number of the taps varied in a single tap-redistribution among subbands with reference to a relative relationship of the number of the taps varied among the subbands.

DESCRIPTION OF THE PREFERRED EMBODIMENTS

Figure 1:
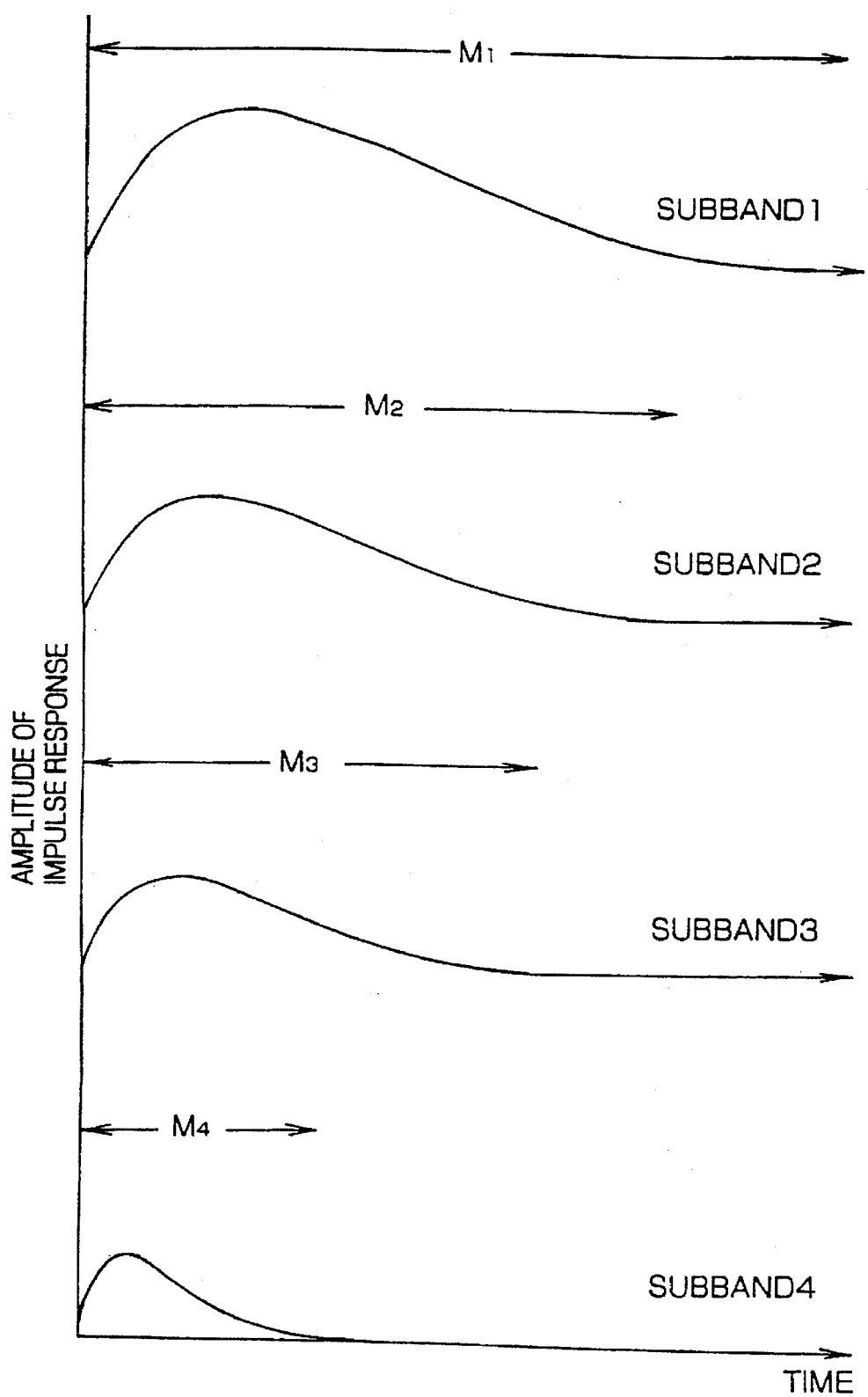
FIG. 1 is a view of impulse responses decomposed into subbands for use in describing operation of a conventional identification method and an identification method according to this invention.

Referring to FIG. 1, description will be made as regards a typical impulse response in each subband when an acoustic echo is divided into first through fourth subbands 1 to 4. The first subband 1 is the lowest among the first through the fourth subbands 1 to 4. The second subband 2 is the second lowest among the the first through the fourth subbands 1 to 4. The third subband 3 is lower than the fourth subband 4. That is, the fourth subband 4 is the highest among the first through the fourth subbands 1 to 4. When first through fourth impulse responses produced in the first through the fourth bands 1 to 4 have durations represented by $M_1, M_2, M_3$, and $M_4$, respectively, the relationship $M_1 \geq M_2 \geq M_3 \geq M_4$ holds. Thus, a low-band impulse response is longer than a high-band impulse response when the acoustic echo is subjected to subband decomposition. The number of taps N of an adaptive filter corresponding to each subband must be equal to or longer than the duration of the corresponding impulse response in time as described above.

Taking also this characteristic into consideration, proposal is made of a subband adaptive filter which is disclosed in the Document 5 and which is capable of reducing the calculation amount and shortening a convergence time by adaptively controlling the number of taps of the adaptive filter for each subband.

Figure 2:
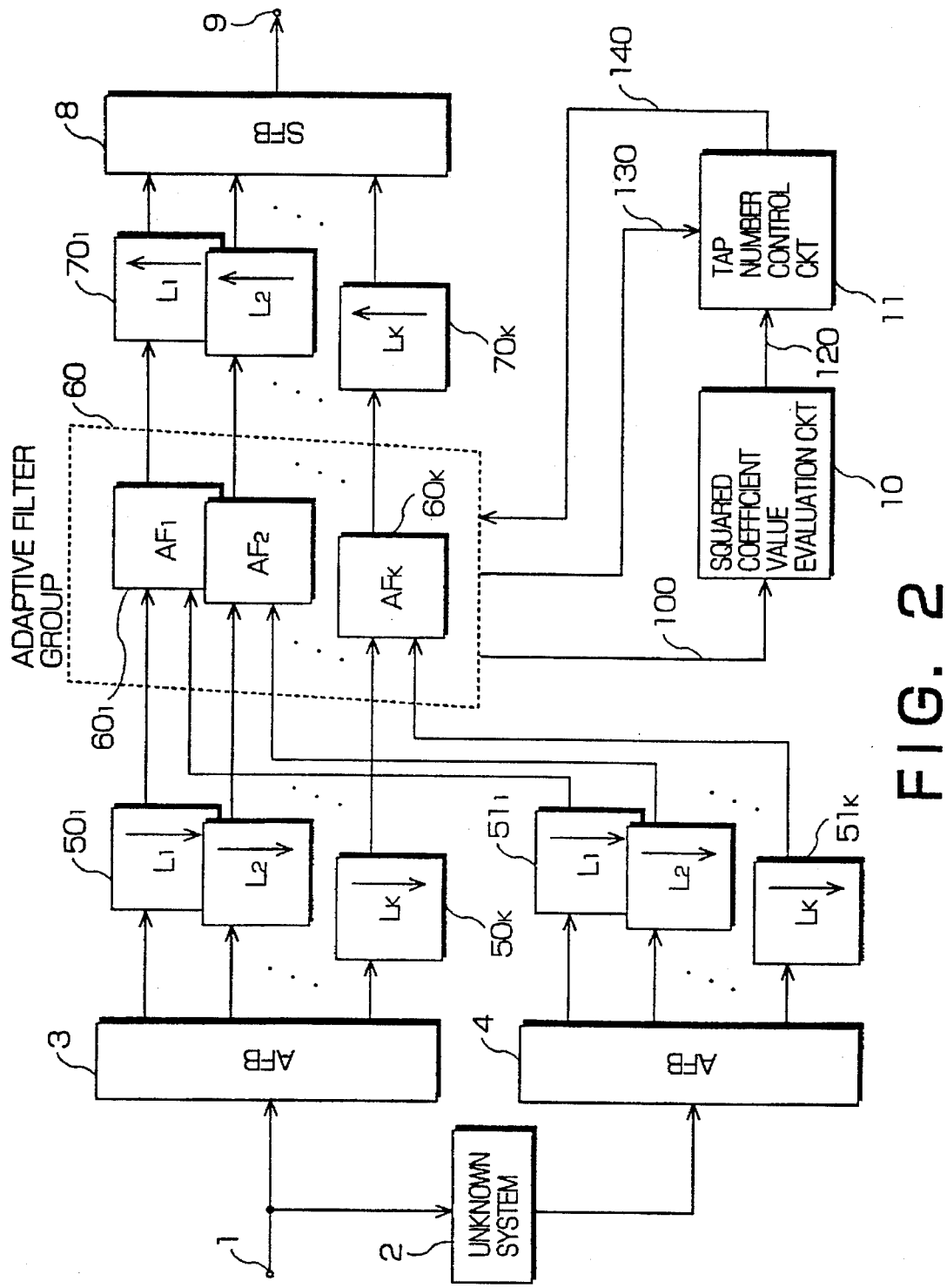
FIG. 2 is a block diagram of an identification apparatus for carrying out a conventional identification method.

Turning to FIG. 2, description will proceed to a conventional identification apparatus using the subband adaptive filter disclosed in the Document 5. In the identification apparatus, the number of the taps of the adaptive filter is adaptively determined in response to a result of evaluation of the information relating to the coefficient value obtained from each adaptive filter and the information relating to a reference signal.

According to the identification apparatus, an input signal from an input terminal 1 is divided by an analysis filter bank (AFB) 3 into a plurality of subband input signals. Each subband input signal is subsampled by a subsampling circuit $50_i$ (i=1, 2, . . . , K) into $1/L_i$ and supplied to an independent adaptive filter $60_i$ (i=1, 2, . . . , K) in an adaptive filter group 60. Typically, $L_i$ is selected to be equal to K. On the other hand, an output signal of an unknown system 2 to be identified (namely, an echo in case of the echo canceller) is divided by another analysis filter bank (AFB) 4 having a characteristic quite identical with that of the analysis filter bank 3 into a plurality of bands to produce subband echoes. Thereafter, each subband echo is subsampled by a subsampling circuit $51_i$ (i=1, 2, . . . , K) into $1/L_i$ and supplied to the adaptive filter $60_i$. The adaptive filter $60_i$ calculates a difference between a subband echo replica and a subsampled subband echo to produce a subband error signal as an output of the adaptive filter. The adaptive filter $60_i$ renews its coefficient by the use of the subband error signal. The subband error signal is interpolated by an interpolating circuit $70_i$ (i=1, 2, . . . , K) to Li times and then supplied to a synthesis filter bank (SFB) 8 to be subjected to band synthesis. Thereafter, a synthesized signal is transmitted to an output terminal 9. Accordingly, if each subband error signal is sufficiently small (that is, if the subband echo is well suppressed in each subband), the signal obtained at the output terminal 9 is echo-suppressed with respect to the full band.

A squared coefficient value evaluation circuit 10 is supplied with a coefficient value signal 100 from the adaptive filter $60_i$ (i=1, 2, ..., K) in each subband. A coefficient vector $C_{i,k}$ of the adaptive filter $60_i$ at the time instant k is represented by:

$$C_{i,k} = [C_{i,1,k}\ C_{i,2,k}\ \ldots\ C_{i,N,k}]^T, \tag{1}$$

where $C_{i,n,k}$ (n=1, 2, ..., N) represents a coefficient value of an n-th tap of the adaptive filter $60_i$ at the time instant k, $[\cdot\ \cdot]^T$ representing a transposition of $[\cdot\ \cdot]$. The squared coefficient value evaluation circuit 10 calculates a vector $\overline{C}_{i,k}$ in correspondence to each subband. The vector $\overline{C}_{i,k}$ is represented by:

$$\overline{C}_{i,k} = [C_{i,Ni-P+1,k}\ C_{i,Ni-P+2,k}\ \ldots\ C_{i,Ni,k}]^T, \tag{2}$$

where P is a positive integer and Ni,k (will hereunder be writen as $N_{i,k}$ for convenience of description) represents the number of taps of the adaptive filter in the i-th subband at the time instant k. Thus, in every band, the coefficient corresponding to P taps from the tail are used in evaluation. The squared coefficient value evaluation circuit 10 calculates:

$$\overline{C}_k = [\overline{C}_{1,k}^T \overline{C}_{1,k}\ \overline{C}_{2,k}^T \overline{C}_{2,k}\ \ldots\ \overline{C}_{K,k}^T \overline{C}_{K,k}] \tag{3}$$

to be delivered to a control circuit 11 for the number of taps as a subband tail coefficient signal vector 120. The control circuit 11 is supplied with an input signal power 130 of each adaptive filter in addition to an output signal of the squared coefficient value evaluation circuit 10. Herein, the input signal vector at the time instant k is represented by $V_k$. By the use of the input signal power $v_{i,k}$ (i=1, 2, ..., K) in the i-th subband, $$V_k = [v_{1,k}\ v_{2,k}\ \ldots\ v_{K,k}]^T \tag{4}$$

is given.

The control circuit 11 calculates, by the use of a subband tail coefficient signal:

$$\overline{C}_{i,k}^T \overline{C}_{i,k}$$

and the input signal power $v_{i,k}$ (i=1, 2, ..., K), the number of taps of each adaptive filter once at every U times of renewal of the coefficient of the adaptive filter. Herein, U represents a positive integer. The number of taps $N_{i,mU}$ of the i-th subband adaptive filter at the time instant mU is given by the following equations by the use of the number of taps $N_{i,(m-1)U}$ at the time instant (m-1)U.

$$N_{i,mU} = N_{i,(m-1)U} - R + R \cdot \Phi_{i,mU} \tag{5}$$

and $$\Phi_{i,mU} = INT\left[ K \times \frac{\sum_{p=(m-1)U+1}^{mU} v_{i,p} \overline{C}_{i,p}^T \overline{C}_{i,p}}{\sum_{p=(m-1)U+1}^{mU} \text{trace}\{V_p \overline{C}_p\}} \right], \tag{6}$$

where m represents a positive integer, trace{–}, a trace of a matrix, INT[·], an integer-forming operator, R, the number of taps deleted from one subband in a single step of redistribution of the tap coefficients. Herein, the number taps of each subband is also dependent upon the power of the subband input signal. The subband with a greater signal power is assigned with a greater number of taps.

A signal 140 representing the number of taps in each subband is obtained by the above-mentioned evaluation and transmitted to the adaptive filter $60_i$ (i=1, 2, ..., K).

Figure 3:
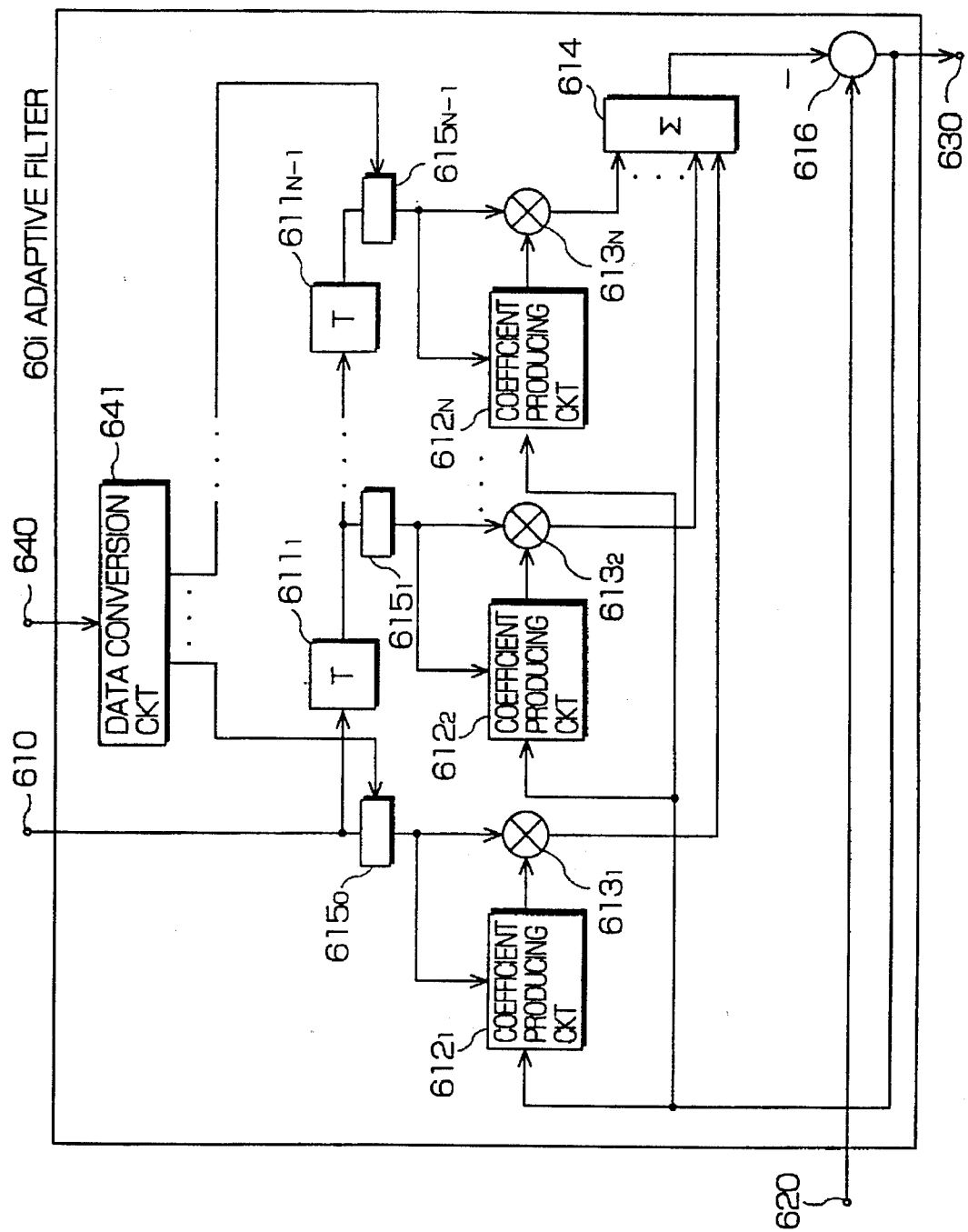
FIG. 3 is a block diagram of an adaptive filter used in the identification apparatus of FIG. 2 and in an identification apparatus according to this invention.

Turning to FIG. 3, an example of the adaptive filter $60_i$ (i=1, 2, ..., K) is illustrated. An input terminal 610 is supplied with the subband input signal from the subsampling circuit $50_i$. An input terminal 620 is supplied with the subband reference signal from the subsampling circuit $51_i$. The subband error signal is delivered to an output terminal 630 to be transmitted to the interpolating circuit $70_i$. An input terminal 640 is supplied with the number of taps $N_{i,k}$ from the control circuit 11 for the number of taps. The signal supplied to the input terminal 610 is given to a tapped delay line comprising a plurality of delay elements $611_1, \ldots, 611_{N-1}$ for producing a delay of one sampling period. The input signal sample supplied to the delay element $611_1$ is transferred to the next adjacent delay element $611_i$ at every one clock. The delay elements $611_i$ (i=1, 2, ..., N-1) produce output signals which are supplied through switches $615_0, 615_1, \ldots, 615_{N-1}$ to corresponding multipliers $613_{i+1}$, respectively, to be multiplied by signals supplied from corresponding coefficient producing circuit $612_{i+1}$. The multiplier $613_i$ is supplied with the signals directly from the input terminal 610. All output signals of the multipliers $613_1, \ldots, 613_n$ are added by an adder 614 to produce an output signal which is delivered to a subtractor 616. The subtractor 616 is supplied through the input terminal 620 with the subband reference signal. The output signal of the adder 614 is subtracted from the subband reference signal to produce an error signal which is delivered to the output terminal 630.

A data conversion circuit 641 receives the number of taps $N_{i,k}$ and converts it to control signals for the switches $615_0, 615_1, \ldots, 615_{N-1}$. For example, the number of taps $N_{i,k}$ is supplied in the form of $N_{i,k}=U$ (U being a positive integer). The data conver-sion circuit 641 converts the number of taps to produce a sequence in which a u-th element alone is equal to 0 and all other elements are equal to 1. Herein, $U \leq u \leq N-1$. The j-th element of this sequence is supplied to the switch $615_j$. All of the switches $615_0, 615_1, \ldots, 615_{N-1}$ are operable to open the circuit when supplied with "1" and to close the circuit when supplied with "0". Accordingly, the switches $615_U, 615_{U+1}, \ldots, 615_{N-1}$ are all turned off so that the signals are not transmitted to the multipliers $613_{U+1}, \ldots, 613_{N-1}$. This is equivalent to the operation of the adaptive filter with U taps.

Figure 4:
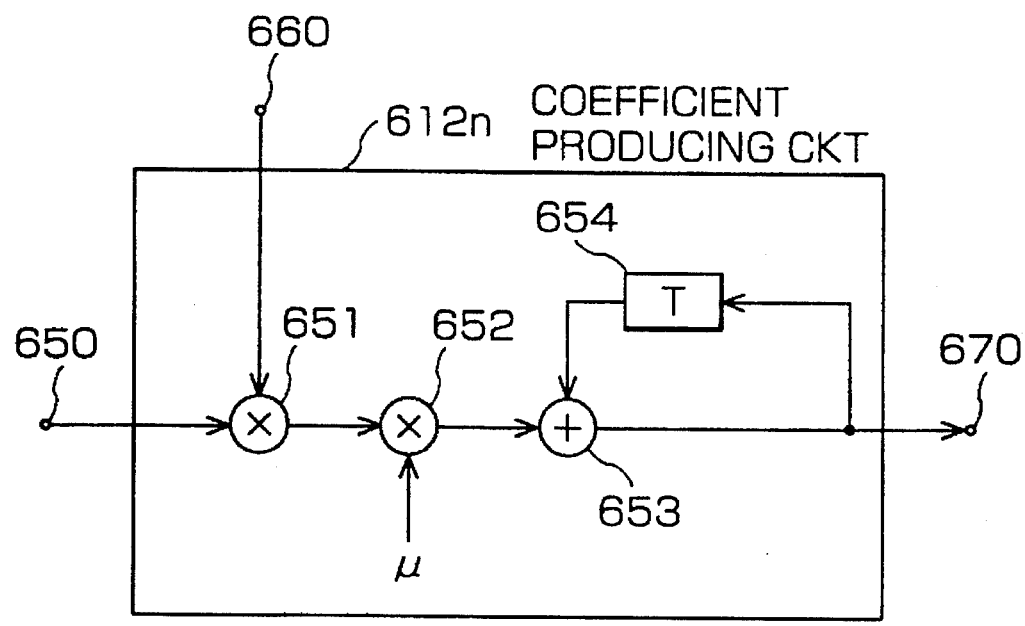
FIG. 4 is a block diagram of a coefficient producing circuit of the adaptive filter of FIG. 3.

Turning to FIG. 4, a structure of the coefficient producing circuit $612_n$ (n=1, 2, ..., N) is illustrated with an assumption that the LMS algorithm described in the Document 1 is used as a coefficient renewal algorithm. The output of the subtractor 616 (FIG. 3) is supplied to an input terminal 650. The signal from the switch $615_{n-1}$ in FIG. 3 is supplied to an input terminal 660. The signal obtained at an output terminal 670 is delivered to the multiplier $613_i$ in FIG. 3. The signal from the input terminal 650 and the signal from the input terminal 660 are multiplied by a multiplier 651. A multiplication result signal is supplied to a multiplier 652. The multiplier 652 multiplies the supplied signal by a predetermined constant μ to produce a product which is delivered to an adder 653. On the other hand, the adder 653 is also supplied with an addition output of the adder 653 after passing through a delay element 654 to be delayed by one sampling period. A loop circuit comprising the delay element 654 and the adder 653 calculates an accumulated total sum of those values supplied from the multiplier 652. A single cycle of the loop circuit is equivalent to a single step of renewal of the coefficient.

In the conventional example described above, when the number of taps $N_{i,k}$ of the adaptive filter $60_i$ ($i=1, 2, \ldots, K$) is adaptively controlled, a variable amount in a single step is determined to be equal to the constant R. In order to achieve a sufficiently small error level at the time instant of convergence of the adaptive filter $60_i$, R must be sufficiently small. This increases the convergence time. On the other hand, if R is large, the final error can not be sufficiently small although the convergence time is short. Thus, in selection of R, there is a trade-off between the convergence time and the final error.

This invention provides a method and an apparatus for identifying an unknown system by the use of a subband adaptive filter, which is capable of reducing a final error and shortening a convergence time by adaptively controlling the number of variable taps in a single step when the number of taps of an adaptive filter in each subband is adaptively controlled.

According to this invention which will presently be described, the number of taps of the adaptive filter is adaptively determined in accordance with a result of evaluation of information such as the coefficient value obtained from each adaptive filter and the input signal. When the number of taps of the adaptive filter in each subband is adaptively determined, the variable amount in a single step is adaptively controlled by the use of the variable amount in the past.

Figure 5:
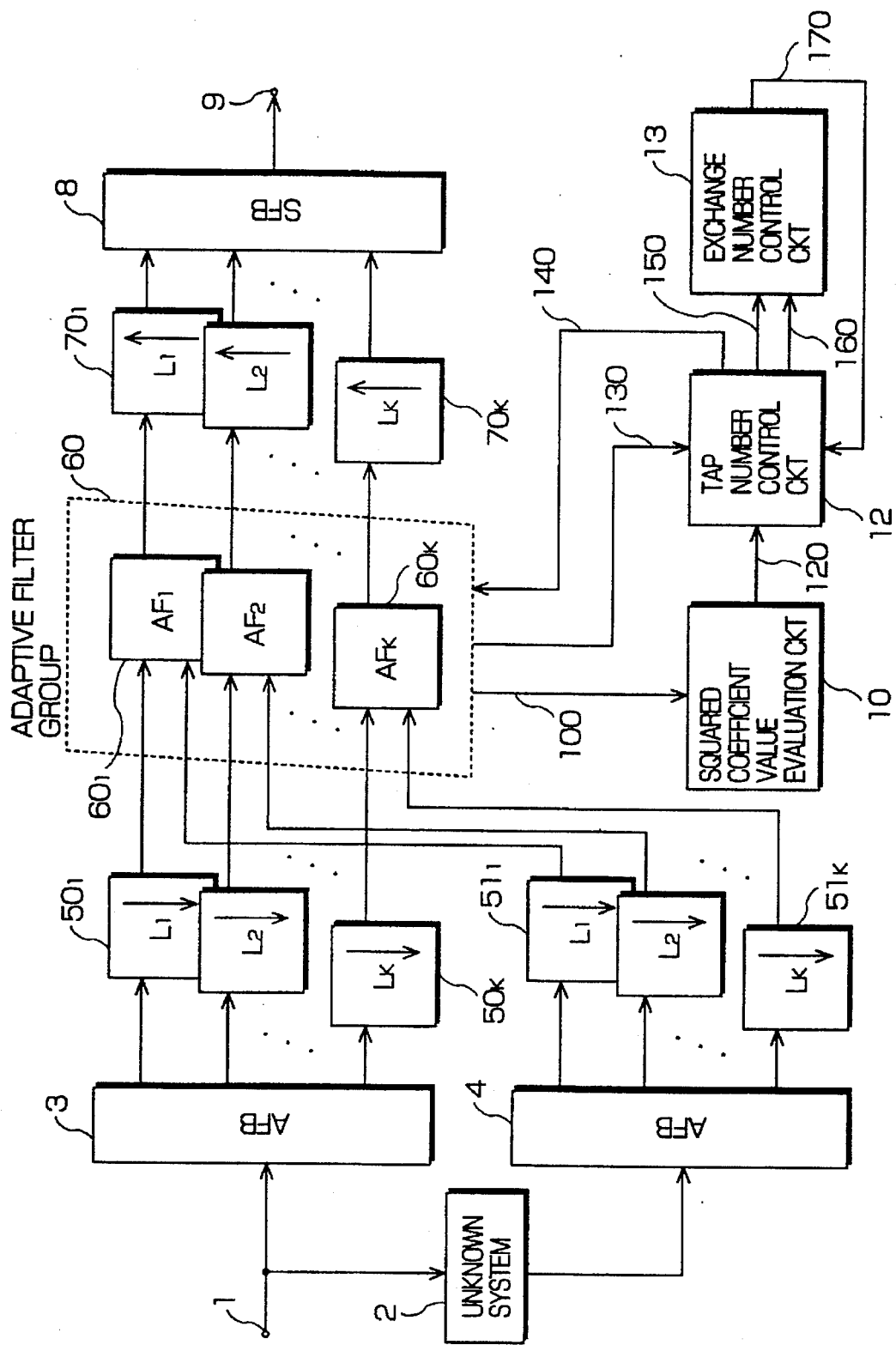
FIG. 5 is a block diagram of an identification apparatus for carrying out an identification method according to a first embodiment of this invention.

Turning to FIG. 5, description will proceed to an identification apparatus for carrying out an identification method according to a first embodiment of this invention. The difference between an apparatus illustrated in FIG. 5 and the conventional apparatus illustrated in FIG. 2 resides in a control circuit 12 for the number of taps and an exchange number control circuit 13. In FIG. 5, the parts similar to those in FIG. 2 are designated by like reference numerals.

Figure 7:
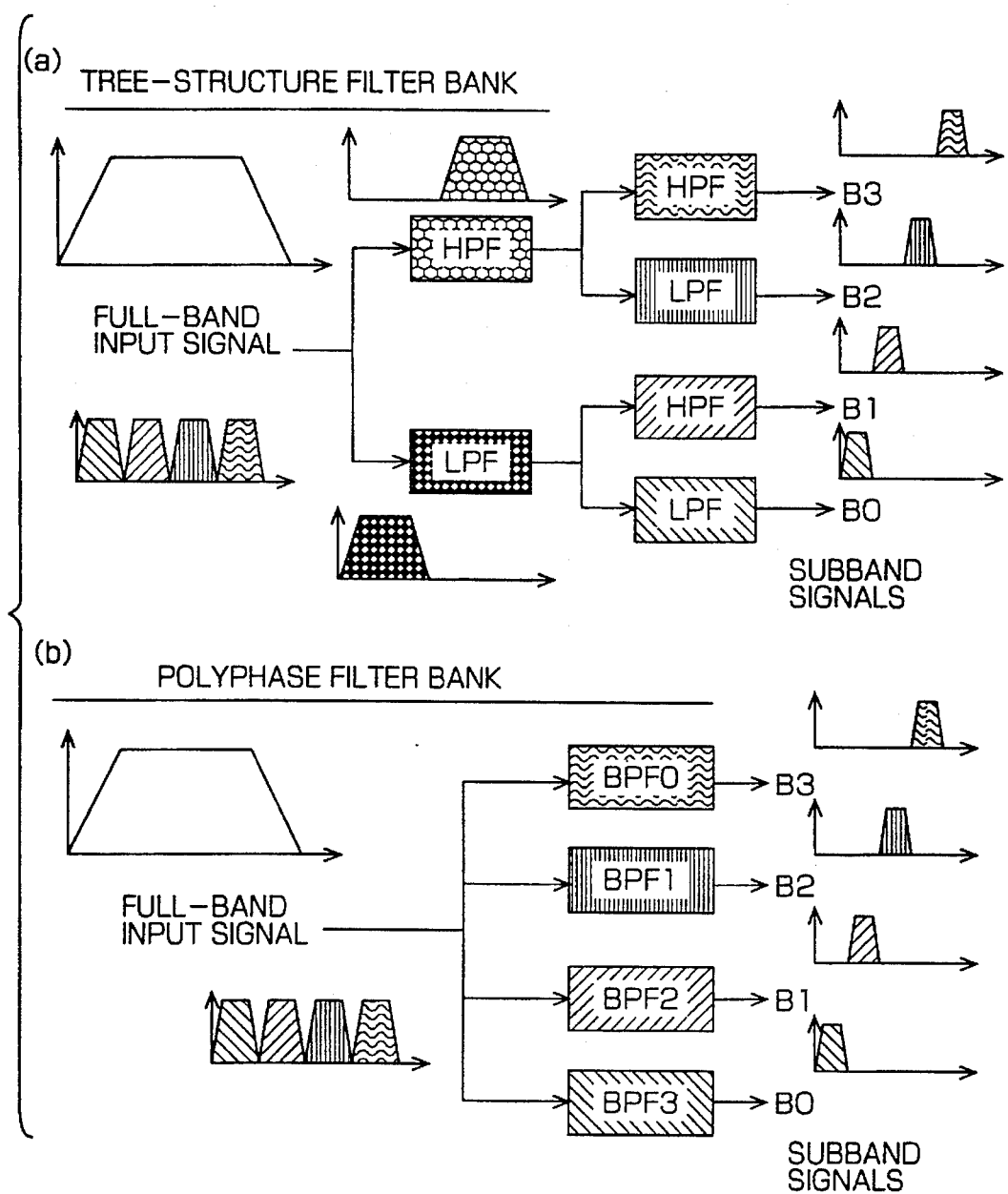
FIG. 7 is a view for use in describing filter banks used in the identification apparatuses of FIGS. 5 and 6.

In the conventional control circuit 11 for the number of taps illustrated in FIG. 7, the number of taps $N_{i,mU}$ of the i-th subband adaptive filter at the time instant mU is given by the following equations by the use of the number of taps $N_{i,(m-1)U}$ at the time instant $(m-1)U$.

$$N_{i,mU} = N_{i,(m-1)U} - R + R \cdot \Phi_{i,mU} \qquad (7)$$

$$\Phi_{i,mU} = INT\left[ K \times \frac{\sum_{p=(m-1)U+1}^{mU} v_{i,p}\overline{C}_{i,p}^T\overline{C}_{i,p}}{\sum_{p=(m-1)U+1}^{mU} \text{trace}\{V_p\overline{C}_p\}} \right] \qquad (8)$$

$\phi_{i,mU}$ represents a redistributed number of taps of the i-th subband adaptive filter at the time instant mU. Specifically, R taps are removed from the i-th subband adaptive filter for redistribution and $R \cdot \phi_{i,mU}$ taps are redistributed.

It is possible to say that $\phi_{i,mU}$ reflects the degree of shortage of the taps of the i-th subband adaptive filter at the time instant mU. Let a single subband be taken into consideration. When the indicator $\phi_{i,mU}$ is consecutively large, the shortage of the taps of the adaptive filter in the corresponding subband is serious. It is therefore preferable to increase the redistributed number of taps in a single step. On the contrary, when the variable $\phi_{i,mU}$ increases or decreases, the shortage of the taps of the adaptive filter in the corresponding subband is insignificant. It is therefore preferable to reduce the redistributed number of taps in a single step so as to precisely adjust tap distribution.

In accordance with the above-mentioned principle, in the control circuit 12 for the number of taps of this embodiment, the number of taps $N_{i,mU}$ of the i-th subband adaptive filter at the time instant mU is given by the following equation by the use of the number of taps $N_{i,(m-1)U}$ at the time instant $(m-1)U$.

$$N_{i,mU} = N_{i,(m-1)U} - R_{(m-1)U}(1 - \phi_{i,mU}) \qquad (9)$$

The difference between the control circuit 11 in the conventional apparatus and the control circuit 12 of the apparatus of this embodiment resides in that the redistributed number of taps in a single step is replaced from the constant R into a variable $R_{(m-1)U}$.

The redistributed number of taps $R_{(m-1)U}$ in a single step to be used in the control circuit 12 for the number of taps is supplied from the exchange number control circuit 13 as a signal 170. The redistributed number of taps $R_{mU}$ is calculated as follows in the exchange number control circuit 13.

$$R_{mU} = R_{(m-1)U} + R_0 \times \theta_{mU} \qquad (10)$$

$$\theta_{mU} = \begin{cases} +1 \text{ for } \gamma_{mU} = \gamma_{(m-1)U} = \ldots \gamma_{mU-r} \\ -1 \text{ otherwise} \end{cases} \qquad (11)$$

Herein, $\gamma_{mU}$ is defined by a subband index i giving max $\{\phi_{i,mU}\}$. Specifically, $\theta_{mU}$ is equal to +1 when the maximum value of $\phi_{i,mU}$ is given by the same subband for r consecutive times and, otherwise, is equal to −1. $R_0$ is a predetermined constant. The exchange number control circuit 13 is supplied with $R_{(m-1)U}$ and $\phi_{i,mU}$ as signals 150 and 160, respectively, for use in calculation of Equations (10) and (11). On the other hand, $R_{mU}$ calculated by the exchange number control circuit 13 is delayed by U sampling periods to become $R_{(m-1)U}$ which is fed back to the control circuit 12 for the number of taps as a signal 170 for use in calculation of Equation (9).

In Equation (9), the redistributable number of taps is equal to $KR_{(m-1)U}$. As a result of an integer-forming operation, the redistributable number of taps and the redistributed number of taps may not always be coincident.

$$\sum_{i=1}^{K} \Phi_{i,mU} \neq K \qquad (12)$$

Specifically, when the number of taps is too large or too small, precise control can be carried out with reference to the value of $\phi_{i,mU}$, for example. A signal 140 representative of the number of taps in each subband is obtained by the above-mentioned evaluation and delivered from the control circuit 12 for the number of taps to the adaptive filter $60_i$ ($i=1, 2, \ldots, K$).

Figure 6:
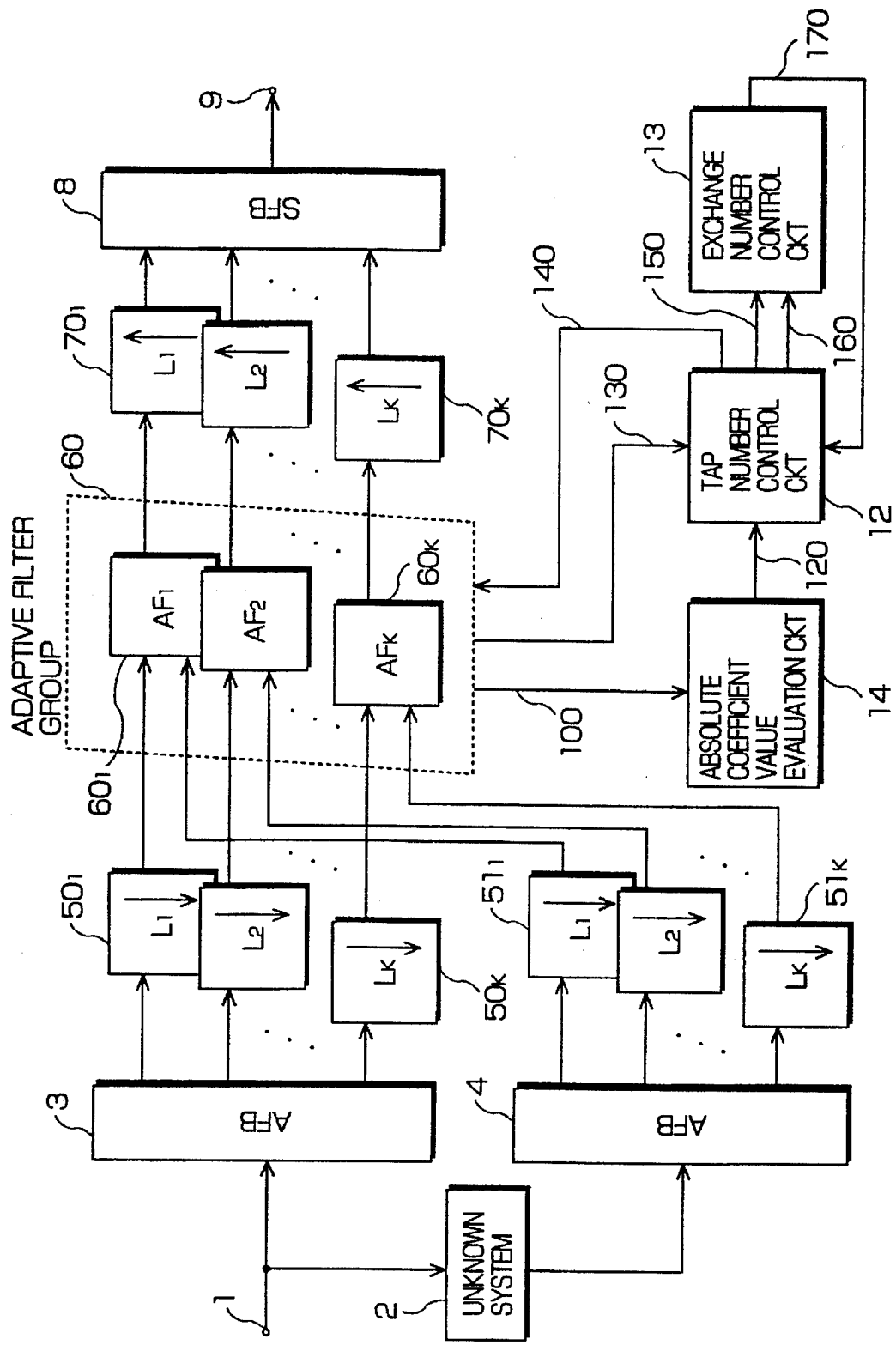
FIG. 6 is a block diagram of an identification apparatus for carrying out an identification method according to a second embodiment of this invention.

Turning to FIG. 6, description will proceed to an identification apparatus for carrying out an identification method according to a second embodiment of this invention. FIG. 6 is obtained by replacing, in FIG. 5 illustrating the first embodiment of this invention, the squared coefficient value evaluation circuit 10 by an absolute coefficient value evaluation circuit 14. In FIG. 6, the parts similar to those in FIG. 2 are designated by like reference numerals.

The absolute coefficient value evaluation circuit 14 in FIG. 2 calculates, instead of $\overline{C}_k$ produced by the squared coefficient value evaluation circuit 10 in FIG. 2, $$\sum_{j=N_{(m-1)U}-P+1}^{N_{(m-1)U}} |C_{i,j,k}|$$

which is delivered to the control circuit 12 for the number of taps. The control circuit 12 executes Equations (13) and (14) instead of Equations (8) and (9).

$$N_{i,mU} = N_{i,(m-1)U} - R(m-1)u \cdot (1 - \Psi_{i,mU}) \tag{13}$$

$$\Psi_{i,mU} = INT\left[K \times \frac{\sum\limits_{p=(m-1)U+1}^{mU} v_{i,p} \sum\limits_{j=N_{(m-1)U}-P+1}^{N_{(m-1)U}} |C_{i,j,p}|}{\sum\limits_{p=(m-1)U+1}^{mU} \sum\limits_{i=1}^{K} v_{i,p} \sum\limits_{j=N_{(m-1)U}-P+1}^{N_{(m-1)U}} |C_{i,j,p}|}\right] \tag{14}$$

The structure and the operation except the above are quite similar to those of the first embodiment. It is noted here that $\gamma_{mU}$ in Equation (11) is defined by the subband index i giving $\max\{\Psi_{i,mU}\}$.

Description will proceed to an identification apparatus for carrying out an identification method according to a third embodiment of this invention. According to this identification apparatus, calculation of the redistributed number of taps $R_{mU}$ in the exchange number control circuit 13 in the first and the second embodiments is carried out by the following algorithm.

$$R_{mU} = \frac{\max\{\Phi_{i,mU}\}}{\min\{\Phi_{i,mU}\}} \tag{15}$$

Specifically, the redistributed number of taps $R_{mU}$ is determined with reference to a ratio of the maximum value and the minimum value of $\phi_{i,mU}$. Equation (15) corresponds to the first embodiment. To the second embodiment, the following equation corresponds.

$$R_{mU} = \frac{\max\{\Psi_{i,mU}\}}{\min\{\Psi_{i,mU}\}} \tag{16}$$

The operation is similar to those of the first and the second embodiments except the calculation of the redistributed number of taps $R_{mU}$. Accordingly, detailed description will not be made.

Turning to FIG. 7, description will proceed to analysis filter banks 3 and 4 (FIGS. 5 and 6) and a synthesis filter bank 8 (FIGS. 5 and 6). In the foregoing description of the embodiments, no reference has been made to the structures of the analysis filter banks 3 and 4 and the synthesis filter bank 8. The structures and designs of those filter banks are described in detail in an article which is contributed by P. P. Vaidyanathan to Proceedings of the IEEE, Vol. 78, No. 1, January 1990, pages 56–93 (will hereunder be called "Document 6"). As typical structures of the filter banks, a tree structure filter bank based on QMF (quadrature mirror filter), and a polyphase filter bank as shown in FIG. 7. The tree structure filter bank obtains the subband signals by repeating binary division of the input signal band. The polyphase filter bank obtains the subband signals through single-step division by the use of bandpass filters corresponding to the subbands to be finally obtained and equal in number to the subbands.

Although no discussion has been made as regards bandwidths of the subbands, a plurality of schemes are known. Uniform division is most popular in which all of the bandwidths of the final subbands are equal to one another (see the Document 6).

Figure 8:
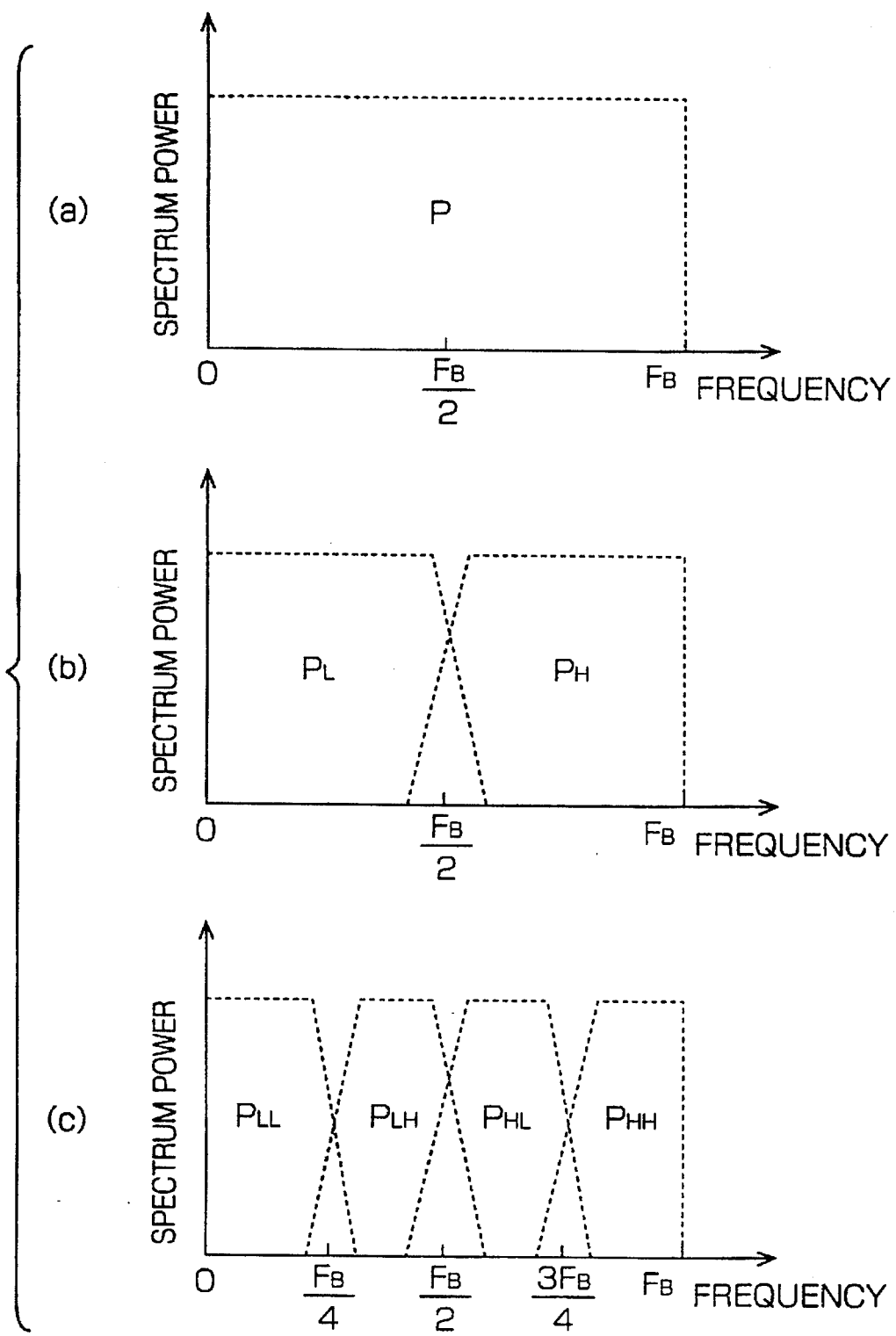
FIG. 8 is a view of uniform subbands for use in describing operation of the identification apparatuses of FIGS. 5 and 6.

FIG. 8 shows examples of binary division and quarternary division of the uniform division. FIG. 8(a) shows an input signal of a bandwidth $F_B$. FIG. 8(b) shows the input signal subjected to the binary division. FIG. 8(c) shows the input signal subjected to the quarternary division. In other words, the subband has a bandwidth $F_B/2$ in FIG. 8(b). The subband has a bandwidth $F_B/4$ in FIG. 8(c).

In comparison with the uniform division, nonuniform division is such that the bandwidths of the final subbands are not equal to one another.

Figure 9:
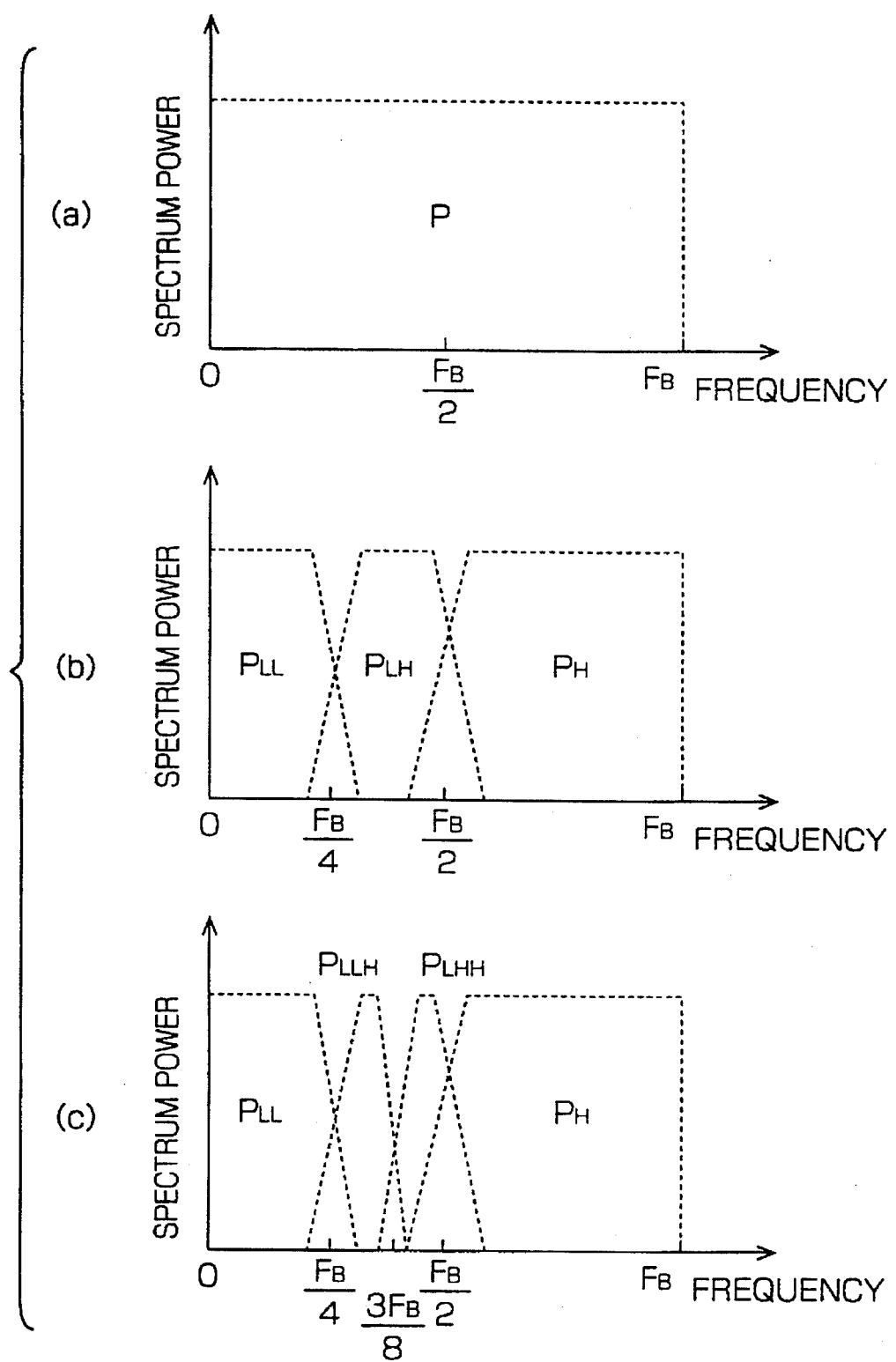
FIG. 9 is a view of nonuniform subbands for use in describing operation of the identification apparatuses of FIGS. 5 and 6.

FIG. 9 shows an example of the nonuniform division. FIG. 9(a) shows an input signal of a bandwidth $F_B$.

FIG. 9(b) shows an example of the nonuniform division. The bandwidths of two lower bands are equal to $F_B/4$. The bandwidth of one higher band is equal to $F_B/2$ which is twice as large as that of the lower band. Such a nonuniform division is called an octave-structure division and is characterized in that the lower band is divided into narrower bands and that a higher subband has a bandwidth equal to an integral multiple of that of a lower subband. Most of acoustic signals present in the nature contain stronger spectrum components in the lower band. In the higher band, variation of the spectrum is small and the power is small. By subband decomposition, spectrum distribution within the subband becomes uniform. The subband adaptive filter is not only rapid in convergence but also efficient in achieving uniform spectrum distribution with a same number of times of division by means of the octave-structure division.

FIG. 9(c) shows another example of the nonuniform division. A single lower band has a bandwidth of $F_B/4$, two intermediate bands have a bandwidth of $F_B/8$, and a single higher band has a bandwidth of $F_B/2$. Such irregular nonuniform division can readily be achieved by a combination of the QMFs or the polyphase filter bank.

The design scheme of a filter bank for nonuniform division at a desired bandwidth ratio is described in an article which is contributed by Shigeo Wada et al to Proceedings of the 6th Symposium on Digital Signal Processing, November 1991, pages 269–274 (will hereunder be called "Document 7"). The Document 3 describes an oversampling method of carrying out subsampling at a ratio smaller than that between the bandwidth of the subband and the bandwidth of the undivided signal before division. This invention imposes no restriction upon the structures of the analysis filter banks 3 and 4 and the synthesis filter bank 8 and is therefore applicable for all of those structures.

Subsequently, description will proceed to identification apparatuses for carrying out identification methods according to fourth and fifth embodiments of this invention. In the first and the second embodiments of FIGS. 5 and 6, the control circuit 12 for the number of taps is supplied from each adaptive filter with the input signal power. Similar operation is expected if an absolute value of the input signal is supplied instead. An absolute input signal value vector $W_k$ is given by the following equation (17) by the use of an absolute input signal value $w_{i,k}$ (i=1, 2, ..., K) in the i-th subband at the time instant k:

$$W_k = [w_{1,k}\ w_{2,k}\ \cdots\ w_{K,k}]^T \tag{17}$$

In this event, control formulae for the number of taps corresponding to Equations (8) and (14) are given by:

$$\Phi_{i,mU} = INT\left[K \times \frac{\sum\limits_{p=(m-1)U+1}^{mU} w_{i,p}\overline{C}_{i,p}^T\overline{C}_{i,p}}{\sum\limits_{p=(m-1)U+1}^{mU} \text{trace}\{W_p\overline{C}_p\}}\right] \tag{18}$$

and $$\Psi_{i,mU} = INT\left[K \times \frac{\sum\limits_{p=(m-1)U+1}^{mU} w_{i,p} \sum\limits_{j=N_{(m-1)U}-P+1}^{N_{(m-1)U}} |C_{i,j,p}|}{\sum\limits_{p=(m-1)U+1}^{mU} \sum\limits_{i=1}^{K} w_{i,p} \sum\limits_{j=N_{(m-1)U}-P+1}^{N_{(m-1)U}} |C_{i,j,p}|}\right] \tag{19}$$

The structure and the operation except the above are quite similar to those of the first and the second embodiments. Accordingly, description thereof will be omitted.

According to a sixth embodiment of this invention, the reference signal may be used instead of the input signal in order to control the number of taps.

According to a seventh embodiment of this invention, the operation similar to the first through the sixth embodiments may be carried out after averaging the coefficient values of the adaptive filter in each subband.

Let $Ave[\overline{C}_{i,p}]$, $Ave[\overline{C}_p]$, and $Ave[C_{i,j,p}]$ be used instead of $\overline{C}_{i,p}$, $\overline{C}_p$, and $C_{i,j,p}$. In this event, corresponding to Equation (8):

$$\Phi_{i,mU} = INT\left[K \times \frac{\sum_{p=(m-1)U+1}^{mU} v_{i,p} Ave[\overline{C}_{i,p}^T] Ave[\overline{C}_{i,p}]}{\sum_{p=(m-1)U+1}^{mU} trace\{V_p Ave[\overline{C}_p]\}}\right] \quad (20)$$

is given. Corresponding to Equation (14):

$$\Psi_{i,mU} = \quad (21)$$

$$INT\left[K \times \frac{\sum_{p=(m-1)U+1}^{mU} v_{i,p} \sum_{j=N(m-1)U-P+1}^{N(m-1)U} |Ave[C_{i,j,p}]|}{\sum_{p=(m-1)U+1}^{mU} \sum_{i=1}^{K} v_{i,p} \sum_{j=N(m-1)U-P+1}^{N(m-1)U} |Ave[C_{i,j,p}]|}\right]$$

is given.

In the foregoing, this invention has been described in conjunction with the first through the seventh embodiments thereof. However, it is readily possible to exchange the specific structures among those embodiments so as to create a novel structure. For example, the algorithm of calculating $R_{mU}$ described in the third embodiment can be applied to the fourth and the fifth embodiments.

In the foregoing, the embodiments of this invention have been described in detail in conjunction with the echo canceller by way of example. However, it will be understood that this invention is also applicable to a noise canceller, a howling canceller, an adaptive equalizer, and the like according to the similar principle. Furthermore, with respect to the tap coefficient renewal algorithm, various other algorithms can be used instead of the algorithm described above by way of example.

As described above, according to this invention, it is possible to adaptively control the variable amount in a single step when the number taps of the adaptive filter in each subband is adaptively controlled. Thus, it is possible to provide a method and an apparatus for identifying an unknown system by the use of a subband adaptive filter, which is capable of reducing a final error and shortening a convergence time.

What is claimed is:

1. A method of identifying an unknown system by the use of a predetermined number K of adaptive filters, each having a plurality of taps, where K is an integer greater than one, said method including the steps of: supplying said unknown system with an input signal; subjecting said input signal to subband analysis to produce a predetermined number K of subband signals; supplying said subband signals to said adaptive filters as filter input signals, respectively; subjecting an output signal of said unknown system to subband analysis to produce a predetermined number K of subband reference signals; producing a predetermined number K of subband error signals representative of differences between said subband reference signals and output signals of said adaptive filters, respectively; and renewing tap coefficients in connection with the taps of each of said adaptive filters on the basis of each of said subband error signals; said method comprising the steps of:

varying the number of the taps of each of said adaptive filters in response to a coefficient value signal representative of values of the tap coefficients in connection with the taps of each of said adaptive filters and to an input information signal relating to each of said filter input signals; and adaptively controlling the number of the taps varied in a single tap-redistribution among subbands with reference to continuous variations of the number of the taps varied among said subbands.

2. A method of identifying an unknown system by the use of a predetermined number K of adaptive filters, each having a plurality of taps, where K is an integer greater than one, said method including the steps of: supplying said unknown system with an input signal; subjecting said input signal to subband analysis to produce a predetermined number K of subband signals; supplying said subband signals to said adaptive filters as filter input signals, respectively; subjecting an output signal of said unknown system to subband analysis to produce a predetermined number K of subband reference signals; producing a predetermined number K of subband error signals representative of differences between said subband reference signals and output signals of said adaptive filters, respectively; and renewing tap coefficients in connection with the taps of each of said adaptive filters on the basis of each of said subband error signals; said method comprising the steps of:

varying the number of the taps of each of said adaptive filters in response to a coefficient value signal representative of values of the tap coefficients in connection with the taps of each of said adaptive filters and to an input information signal relating to each of said filter input signals; and adaptively controlling the number of the taps varied in a single tap-redistribution among subbands with reference to a relative relationship of the number of the taps varied among said subbands.

3. An apparatus for identifying an unknown system by supplying said unknown system with an input signal, said apparatus including: a predetermined number K of adaptive filters, each having a plurality of taps, where K is an integer greater than one; a first analysis filter bank supplied with said input signal for subjecting said input signal to subband analysis to produce a predetermined number K of subband signals which are supplied to said adaptive filters as filter input signals, respectively; a second analysis filter bank supplied with an output signal of said unknown system for subjecting said output signal of said unknown system to subband analysis to produce a predetermined number K of subband reference signals; and a predetermined number K of subtracters for producing a predetermined number K of subband error signals representative of differences between said subband reference signals and output signals of said adaptive filters, respectively, to make each of said adaptive filters renew tap coefficients in connection with the taps of each of said adaptive filters on the basis of each of said subband error signals; said apparatus comprising:

a first circuit connected to said adaptive filters for varying the number of the taps of each of said adaptive filters in response to a coefficient value signal representative of values of the tap coefficients in connection with the taps of each of said adaptive filters and to an input information signal relating to each of said filter input signals; and a second circuit connected to said first circuit for adaptively controlling the number of the taps varied in a single tap-redistribution among subbands with reference to continuous variations of the number of the taps varied among said subbands.

4. An apparatus for identifying an unknown system by supplying said unknown system with an input signal, said apparatus including: a predetermined number K of adaptive filters, each having a plurality of taps, where K is an integer greater than one; a first analysis filter bank supplied with said input signal for subjecting said input signal to subband analysis to produce a predetermined number K of subband signals which are supplied to said adaptive filters as filter input signals, respectively; a second analysis filter bank supplied with an output signal of said unknown system for subjecting said output signal of said unknown system to subband analysis to produce a predetermined number K of subband reference signals; and a predetermined number K of subtracters for producing a predetermined number K of subband error signals representative of differences between said subband reference signals and output signals of said adaptive filters, respectively, to make each of said adaptive filters renew tap coefficients in connection with the taps of each of said adaptive filters on the basis of each of said subband error signals; said apparatus comprising:

a first circuit connected to said adaptive filters for varying the number of the taps of each of said adaptive filters in response to a coefficient value signal representative of values of the tap coefficients in connection with the taps of each of said adaptive filters and to an input information signal relating to each of said filter input signals; and a second circuit connected to said first circuit for adaptively controlling the number of the taps varied in a single tap-redistribution among subbands with reference to a relative relationship of the number of the taps varied among said subbands.

* * * * *